United States Patent
Yamashita

(10) Patent No.: US 7,911,231 B2
(45) Date of Patent: Mar. 22, 2011

(54) SEMICONDUCTOR INTEGRATED CIRCUIT DEVICE

(75) Inventor: Takahiro Yamashita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/728,388

(22) Filed: Mar. 22, 2010

(65) Prior Publication Data

US 2010/0171523 A1    Jul. 8, 2010

Related U.S. Application Data

(62) Division of application No. 11/691,047, filed on Mar. 26, 2007, now abandoned.

(30) Foreign Application Priority Data

Mar. 27, 2006 (JP) .................................. 2006-085204

(51) Int. Cl.
*H03K 19/173* (2006.01)
*H03K 19/177* (2006.01)
*H01L 25/00* (2006.01)

(52) U.S. Cl. ................. 326/62; 326/37; 326/41; 326/47; 326/101

(58) Field of Classification Search .................... 326/26, 326/30, 82–87
See application file for complete search history.

(56) References Cited

U.S. PATENT DOCUMENTS

2004/0080340 A1* 4/2004 Hidaka ............................ 326/83

FOREIGN PATENT DOCUMENTS

| JP | 2003-249563 | 9/2003 |
| JP | 2004-186666 | 7/2004 |
| JP | 2004-350058 | 12/2004 |

OTHER PUBLICATIONS

Usami et al, Automated Selective Multi-Threshold Design for Ultra-Low Standby Applications, ISPLED, 2002, pp. 202-206.
U.S. Office Action for U.S. Appl. No. 11/691,047 mailed on Oct. 20, 2008.
U.S. Office Action for U.S. Appl. No. 11/691,047 mailed on Jun. 6, 2009.
U.S. Office Action for U.S. Appl. No. 11/691,047 mailed on Oct. 20, 2009.

* cited by examiner

*Primary Examiner* — Rexford N Barnie
*Assistant Examiner* — Thienvu V Tran
(74) *Attorney, Agent, or Firm* — Turocy & Watson, LLP

(57) ABSTRACT

A semiconductor integrated circuit device 1 includes a plurality of basic cells 5 each having therein a logic transistor 2 that performs logical operations, and a power switching transistor 3 that can interrupt leakage current when the logic transistor 2 is not operated. The semiconductor integrated circuit device 1 further includes a wiring 6 that connects virtual power nodes 4 as the connection points between the logic transistors 2 and the power switching transistors 3, between individual basic cells 5a and 5b included in a plurality of basic cells 5. Here, a basic cell includes a power switching transistors 3 that can interrupt leakage current when the logic transistors 2 are not operated, in addition to the logic transistors 2. Thereby, switching transistors 3 can be disposed in the optimal positions of the cells 5, and basic cells 5 having a small restriction in disposition and wide scope of application can be provided.

5 Claims, 5 Drawing Sheets

VGND POTENTIALS IN THE THIRD EMBODIMENT (LEFT) AND
VGND POTENTIALS IN THE NORMAL SMT CELL (RIGHT)

SEMICONDUCTOR INTEGRATED CIRCUIT DEVICE

CROSS REFERENCE TO RELATED APPLICATIONS

This application is a Division of application Ser. No. 11/691,047 filed Mar. 26, 2007, the entire contents of which is hereby incorporated by reference.

This application claims benefit of priority under 35 USC §119 to Japanese Patent Application No. 2006-085204 filed on Mar. 27, 2003, the entire contents of which are incorporated herein by reference.

BACKGROUND OF THE INVENTION

1. Field of the Invention

The present invention relates to a semiconductor integrated circuit device, and more specifically, to a semiconductor integrated circuit device including combined logic circuitry of CMOS (complementary metal oxide semiconductor) integrated circuit devices.

2. Background Art

Heretofore, as shown in FIG. 7, a method for elevating the speed of the critical path of logic circuitry using a low-threshold cell wherein a power source switching transistor is provided in a standard cell is disclosed in Non-Patent Document 1. FIG. 7 shows the basic configuration of a conventional MT (multiple threshold-voltage) cell, and (a) shows a two-input NAND cell, (b) shows a two-input NOR cell, and (c) shows a selection MT circuit. The MT cell can simultaneously achieve the high-speed operation of the circuit and a low leakage current in stand-by time.

However, the installation of an independent power switch in each cell limits the effective circuit area by indirect components, and the overhead in term of area (indirect costs) is large. For example, in order to minimize the effect of the added switching transistor, if the size of the switch is twice the size of the transistor to compose logic, the area of the cell is approximately doubled; however, the logical delay time is prolonged by about 20%. For limiting the deterioration of delay time to 10%, it is required to connect a switching transistor having a size of 4 to 5 times the size of the logic transistor.

A method to share a power switch by a plurality of standard cells is normally a method frequently used. Since all the power is not simultaneously consumed even if the switch is shared, the maximum current of the shared switch is smaller than the sum of the maximum currents of a cell. However, since the occurrence of simultaneous switching differs depending on signal patterns, the peak value of current consumption is varied. Therefore, since it is difficult to accurately estimate the peak value of current consumption and the quantity of delay deterioration caused by voltage drop due to switching, it is required to connect a sufficiently large switching transistor.

Therefore, a method for sharing a switch by standard cells themselves wherein no simultaneous switching is clearly known, such as sequential inverters, is proposed in Patent Document (Japanese Patent Laid-Open No. 2003-249563) (refer to FIG. 3 in the bulletin).

However, according to a conventional semiconductor integrated circuit described in the above Patent Document, there were the following two problems. Firstly, in designing a chip in the conventional semiconductor integrated circuit, the switching transistor must be later disposed. Therefore, the switching transistor cannot be disposed in the area where cells are crowded, or must be disposed in the position far from the cells, and there is a problem that the switching transistor cannot be disposed in the optimal position.

Secondly, in cells to be paired, when inverters continue back and forth (refer to FIG. 7 in the bulletin), the normal logic cell having no switch in the cell or the like must be disposed between the cells wherein inverters continue back and forth (refer to FIG. 3 in the bulletin), and there is another problem that the scope of application is limited.

As a conventional art document other than the above-described Patent Document, there is Non-Patent Document (Papers for ISLPED—International Symposium on Low Power Electronics and Design—, 2002, pp. 202-206).

SUMMARY OF THE INVENTION

A semiconductor integrated circuit device according to the first embodiment is a semiconductor integrated circuit device including logic circuitry using a plurality of basic cells each having therein a logic transistor that performs logical operations, and a power switching transistor that can interrupt leakage current when the logic transistors are not operated; further including a wiring that connects a virtual power node, which is a connection point between the logic transistor and the power switching transistor; and another virtual power node, which is a connection point between another logic transistor and another power switching transistor.

A semiconductor integrated circuit device according to the second embodiment is a semiconductor integrated circuit device including logic circuitry using a plurality of basic cells each having a logic output terminal and a virtual power output terminal, which may include a wiring that connects the virtual power output terminal of a basic cell in the plurality of basic cells to the virtual power output terminal of another basic cell.

DETAILED DESCRIPTION OF THE INVENTION

The embodiments of semiconductor integrated circuit devices according to the present invention will be described in detail below referring to the attached drawings. According to these embodiments, switching transistors can be disposed in optimal locations of a cell, and a semiconductor integrated circuit device having a small restriction in disposing and a wide scope of application is provided.

First Embodiment

Figure 1:
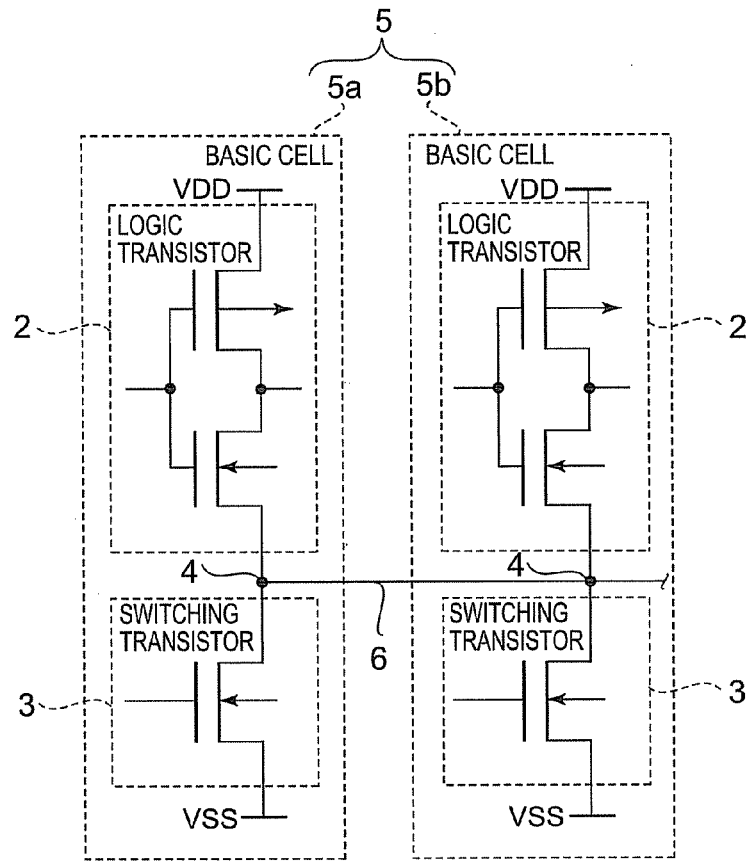
FIG. 1 is a circuit diagram of a semiconductor integrated circuit device according to the first embodiment.

FIG. 1 shows a semiconductor integrated circuit device of the first embodiment. As FIG. 1 shows, the semiconductor integrated circuit device 1 includes a plurality of basic cells 5, each having therein a logic transistor 2 that performs logical operations and a power switching transistor 3 that can interrupt leakage current when the logic transistor 2 is not operated. The semiconductor integrated circuit device 1 further includes a wiring 6 that connects virtual power nodes 4 as the connection points between the logic transistors 2 and the power switching transistors 3, between individual basic cells 5a and 5b included in a plurality of basic cells 5. Here, a basic cell includes a power switching transistors 3 that can interrupt leakage current when the logic transistors 2 are not operated, in addition to the logic transistors 2. In this embodiment, a virtual power node 4 is shared by a plurality of basic cells 5a and 5b.

According to the semiconductor integrated circuit device of the first embodiment having the above-described configuration, by sharing the virtual power node 4 by a plurality of basic cells 5a and 5b, a small-area integrated circuit having high-speed performance in operation while consuming low electric power in the stand-by state can be provided.

Second Embodiment

Figure 2:
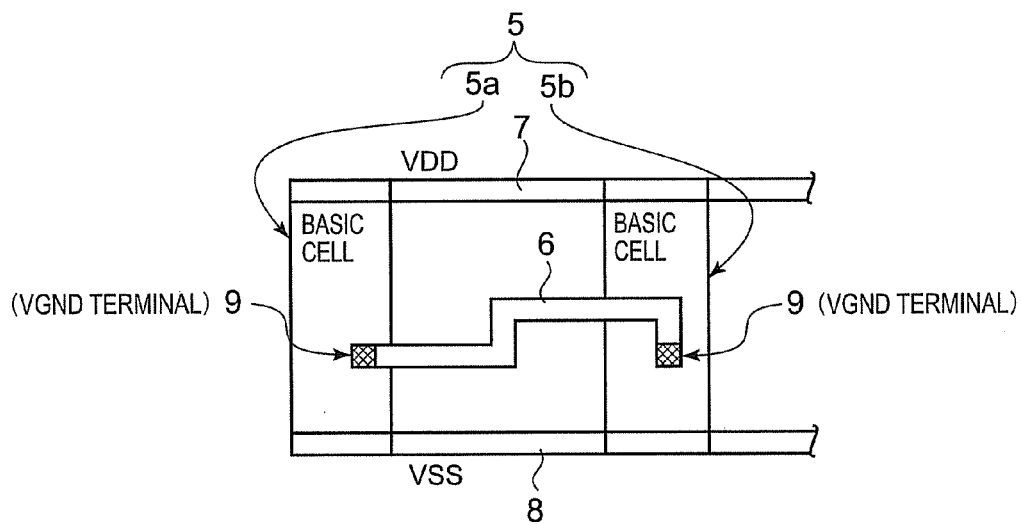
FIG. 2 is a plot plan of a semiconductor integrated circuit device according to the second embodiment.

FIG. 2 shows a semiconductor integrated circuit device of the second embodiment as a specific lay-out example of FIG. 1. In FIG. 2, although power wirings 7 and 8 use thicker wires than the signal line, the wiring 6 that connects the virtual power (VGND) terminals 9 to each other is not required to be thick as normal power wiring, and the provision of a special power wiring region is also not required. The wiring can be a wiring similar to normal signal wiring. This is because a power switch transistor 3 is installed in each basic cell 5, and currents consumed by individual basic cells 5a and 5b flow separately to transistors in the basic cell 5 and to transistors in the other basic cells that share the wiring 6. Normally, the signal wiring 6 can be bent in the middle as shown in FIG. 2, or can be connected across a plurality of wiring layers through a via.

As FIG. 2 shows, it is characterized that individual basic cells 5a and 5b have virtual power output terminals 9 in addition to logic output terminals. The first embodiment is realized by that a certain node 4 (virtual power output terminal 9) in a basic cell 5 is connected to the same node 4 (virtual power output terminal 9) of another cell by the wiring 6.

According to the second embodiment having the above-described configuration, by using the basic cell 5 having virtual power output terminals 9 in addition to logic output terminals, a small-area integrated circuit having high-speed performance in operation while consuming low electric power in the stand-by state can be provided.

In the first and second embodiments, as the wiring 6 between virtual power output terminals 9, by using a grid wiring having the equivalent configuration as the signal wiring, the implementation of the chip can be easily performed.

Third Embodiment

Figure 3:
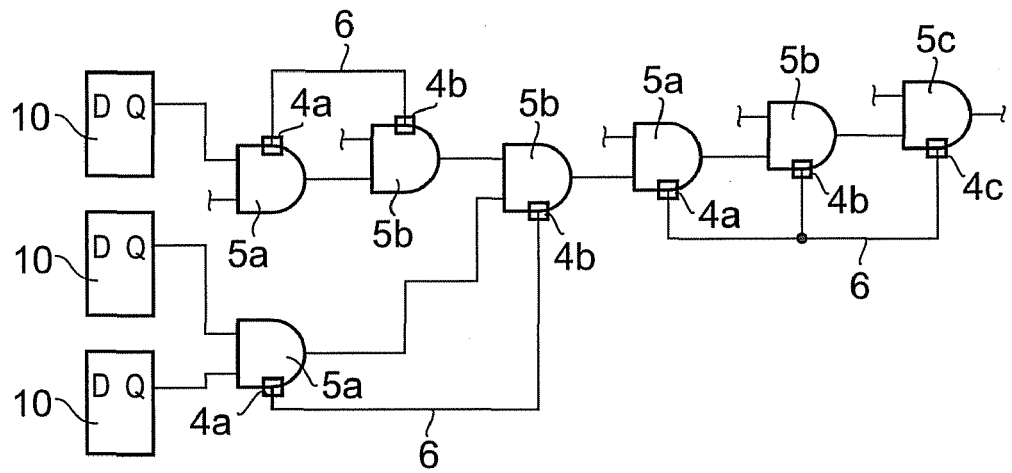
FIG. 3 is a logic circuit diagram of a semiconductor integrated circuit device according to the third embodiment.

FIG. 3 shows a semiconductor integrated circuit device of the third embodiment. The third embodiment is constituted so as to share a switch by making basic cells having an anteroposterior relation in the logic as a cell group. In FIG. 3, a plurality of continuous basic cells 5a and 5b including first basic cells 5a as individual basic cells in the plurality of basic cells 5 that constitute logic circuitry, and second basic cells 5b that makes the output of the first basic cells 5a as the inputs thereof, are made to be a group; and the virtual power nodes 4a and 4b of individual basic cells 5a and 5b in the group are connected to each other by wiring 6. The numeral 10 denotes flip-flops that initially supply signals.

In selecting a cell group, it is sufficient if the logic of cells has an anteroposterior relation, and there is no need to insist on whether the relation is immediately before and immediately after or not. Either positive cells or negative cells may be connected by wiring 6. Although the number of cells connected as a cell group is at least two, any number of cells can be connected as long as there is an anteroposterior relation in the logic as described above. Since the number of cells to be connected is not necessarily an even number, a group can consist of three cells as shown in the right portion of FIG. 3. Even if a group consists of an even number of cells, when a cell is in a physically remote location, or when the cells are crowded and a virtual power (VGND) line cannot be connected, the group may consist of three cells. When cells having an anteroposterior relation in the logic are grouped, the number of cells that transit at an optional time can be limited to only one in the group.

Figure 4:
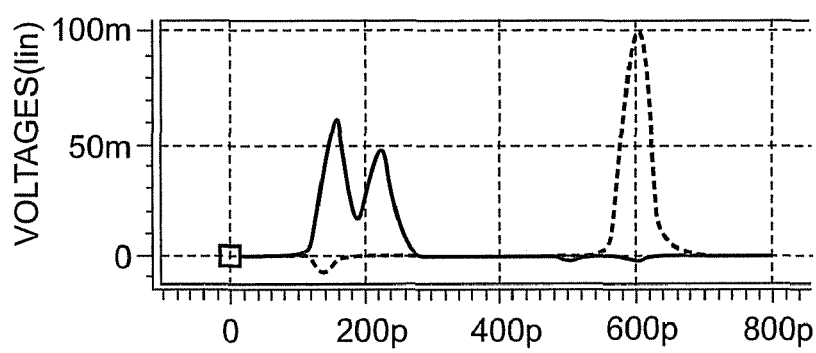
FIG. 4 is a characteristic diagram for illustrating the effect of the third embodiment.

FIG. 4 shows the simulation wave form of VGND potentials according to the third embodiment. What is shown in FIG. 4 is the wave form when three inverters are connected in series, and VGND lines of first and third stages, which become a negative logic, are connected. Compared with the wave form when VGND lines are not shared (right, dotted line), it is known that the elevation of the VGND potential can be suppressed in the wave form when the third embodiment is applied (left, solid line). It is known that sufficient effect can be achieved even if the groups have negative logic. By applying the third embodiment, a small-area integrated circuit of a low power consumption in the time of stand-by, but having high-speed characteristics in operation, can be provided.

Fourth Embodiment

Figure 5:
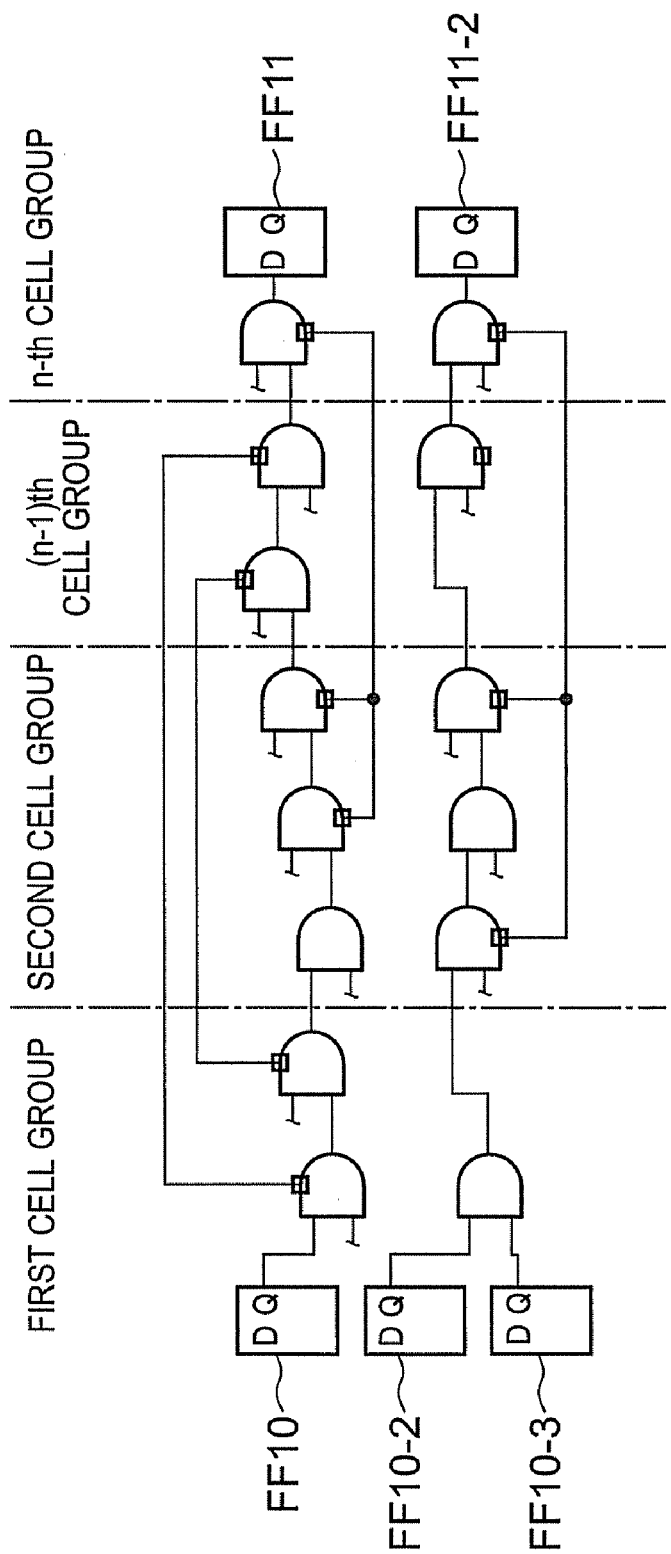
FIG. 5 is a logic circuit diagram of a semiconductor integrated circuit device according to the fourth embodiment.

A semiconductor integrated circuit device according to the fourth embodiment shown in FIG. 5 is a semiconductor integrated circuit device wherein when cells to be grouped (paired) are selected, cells seemed to be logically remote are selected so that the possibility of simultaneous transition is reduced.

As shown in FIG. 5, an optional number of basic cells in a plurality of basic cells 5 that compose a logic circuit are grouped into first to n-th cell groups each consisting of an optional number of basic cells; and among a plurality of basic cells that belong to n groups, the virtual power nodes 4 or the virtual power output terminals 9 of a plurality of basic cells 5 having remote logical operation time are connected to each other with wirings 6. In FIG. 5, the group of cells connected to the output terminals of flip-flops FF 10, FF 10-2 and FF 10-3 is the first cell group; and the group of cells connected to the input terminals of flip-flops FF 11 and FF 11-2 is the nth cell group.

The cells composing combined logic circuitry that has been logically synthesized are classified into a certain number of groups according to the number of cell stages from the flip-flop (FF) output. For example, the first group is composed from the output terminal of FF 10 to the third stage; the second group is composed from the fourth stage to the sixth stage; the third group is composed from the seventh stage to the ninth stage; the group (n−1) is composed from the stage (m−3) to the stage (m−2); and the nth group is composed of the m-th stage.

At this time, cells having a plurality of input terminals, such as an NAND gate, belong to the highest-order group of the countable path length. Here, on grouping, if evaluation is not based only on the number of cell stages, but based on delay information or the like obtained by STA (static timing analysis), classification can be made according to groups of the same degree of delay.

Figure 6:
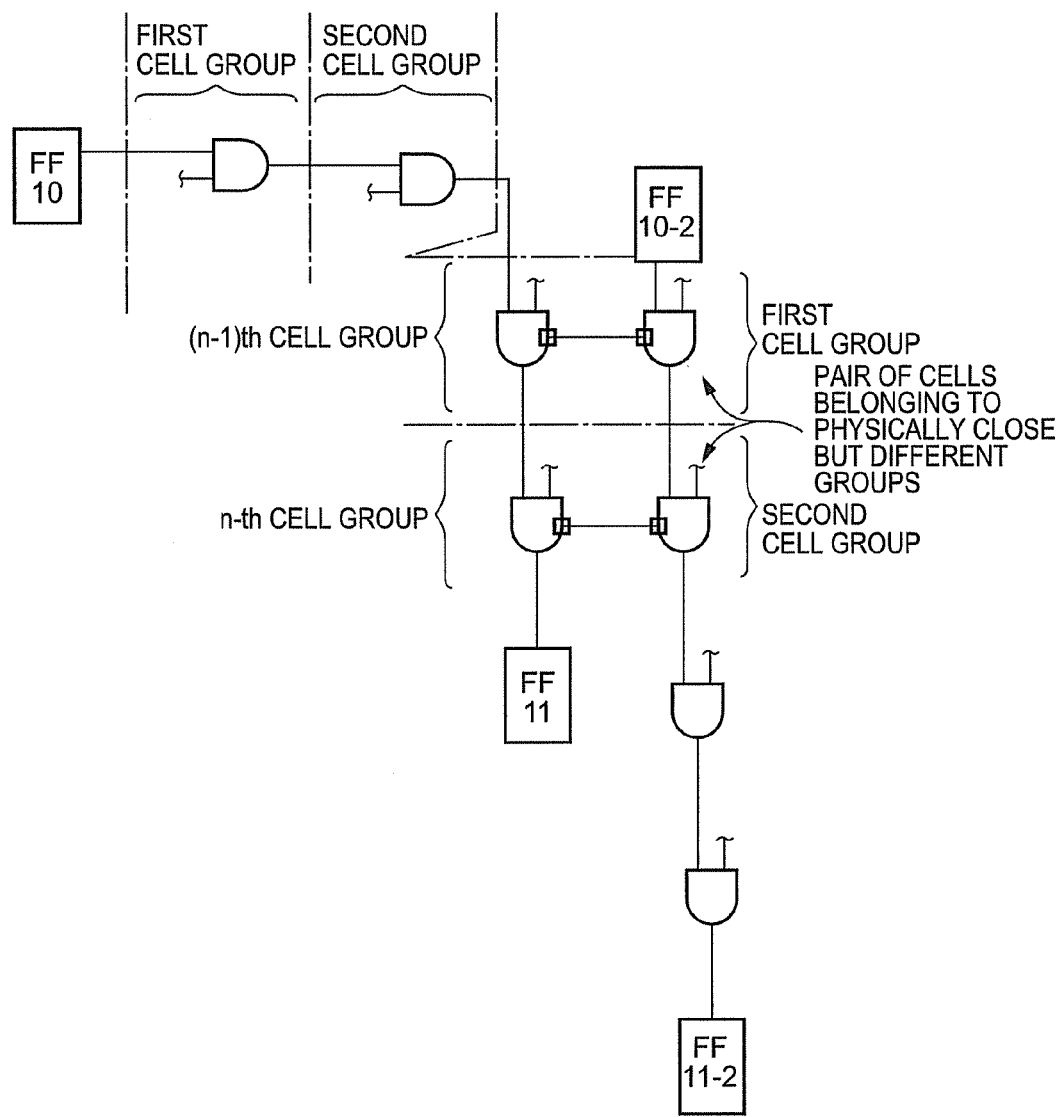
FIG. 6 is another logic circuit diagram of a semiconductor integrated circuit device according to the fourth embodiment.
Figure 7:
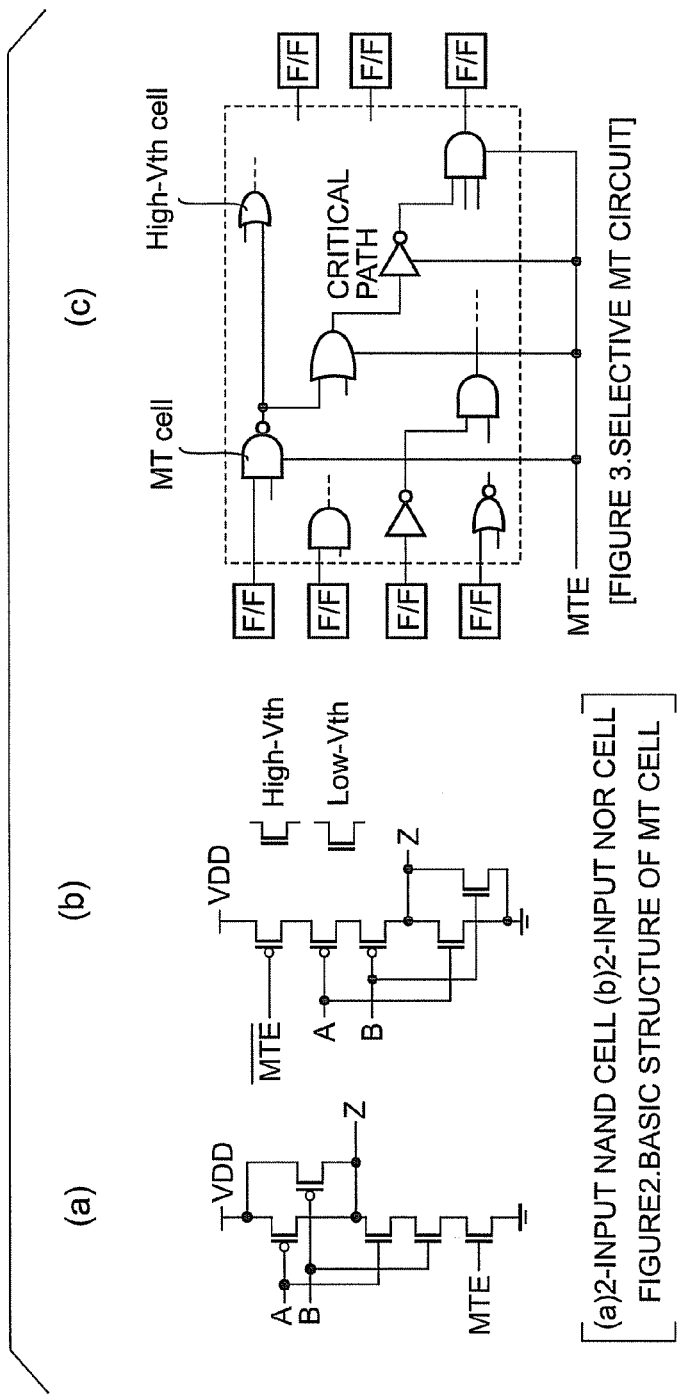
FIG. 7 shows circuit diagrams of (a) a conventional two-input NAND cell, (b) a conventional two-input NOR cell, and (c) a conventional selection MT circuit described in the Non-Patent Document.

Here, cells are assumed to be classified into n groups. Although n groups from the input FF 10 to the output FF 11 are logically arranged in order, actually and physically, they are automatically disposed and wired, and are scattered in the entire area of the chip (block). Therefore, they are often disposed in physically close locations even if they are logically remote. In FIG. 6, the (n−1) cell group in the first to n-th cell group sequentially connected from the flip-flop FF 10 to the flip-flop FF 11 and the first cell group connected from the flip-flop FF 10-2 to the flip-flop FF 11-2 are physically close to each other, but they are different groups. Similarly, the nth cell group sequentially connected from the flip-flop FF 10 to the flip-flop FF11 and the second cell group connected from the flip-flop FF 10-2 to the flip-flop FF 11-2 are physically close to each other, but they are different groups. As shown in FIG. 6, cells in physically close positions but belonging to different groups, specifically, the (n−1)th cell group (FF 10 side) and the first cell group (FF 10-2 side), and the nth cell group (FF 10 side) and the second cell group (FF 10-2 side) can be connected as a pair.

At this time, in logically adjoining groups, for example, as the first group and the second group, there is the case wherein delay times are close to each other. Therefore, a method wherein groups logically not adjacent to each other are paired is also considered. For example, the cells in the first group can be paired with the cells in the third {or (n−1)th} group; or the cells in the second group can be paired with the cells in the fourth (or n-th) group.

Specifically, in the above-described n cell groups, the individual basic cells to which the virtual power nodes are connected by the wiring belong to a cell group that has the physically adjoining but logically not adjoining relationship.

The above-described embodiments provide semiconductor integrated circuit devices that can dispose switching transistors in the optimal locations in a cell, and have small restrictions on disposing and wide scope of applications.

The invention claimed is:

1. A semiconductor integrated circuit device comprising logic circuitry that uses a plurality of basic cells each having a logic output terminal and a virtual power output terminal, further comprising:
   a wiring that connects the virtual power output terminal of a basic cell in the plurality of basic cells to the virtual power output terminal of another basic cell;
   the series of the plurality of basic cells including a first basic cell as one of basic cells in the plurality of basic cells that compose the logic circuitry, and a second basic cell using the output of the first basic cell as an input are treated as a group;
   the virtual power nodes or the virtual power output terminals of individual basic cells in the group are connected to each other with the wiring;
   an optional number of basic cells in a plurality of basic cells that compose logic circuitry are divided into n cell groups, which are first to n-th cell groups each having an optional number of basic cells;
   the virtual power nodes or the virtual power output terminals of a plurality of basic cells having an isolated time of logical operations in a plurality of basic cells belonging to the n cell groups are connected to each other with the wiring;
   the individual basic cells in the n cell groups, wherein the virtual power nodes are connected to each other with the wiring, belong to cell groups not logically adjoining; and
   each of the n cell groups is composed of logic circuitry having common flip-flops to initially supply signals.

2. A semiconductor integrated circuit device comprising logic circuitry that uses a plurality of basic cells each having a logic output terminal and a virtual power output terminal, further comprising:
   a wiring that connects the virtual power output terminal of a basic cell in the plurality of basic cells to the virtual power output terminal of another basic cell;
   the series of the plurality of basic cells including a first basic cell as one of basic cells in the plurality of basic cells that compose the logic circuitry, and a second basic cell using the output of the first basic cell as an input are treated as a group;
   the virtual power nodes or the virtual power output terminals of individual basic cells in the group are connected to each other with the wiring;
   an optional number of basic cells in a plurality of basic cells that compose logic circuitry are divided into n cell groups, which are first to n-th cell groups each having an optional number of basic cells;
   the virtual power nodes or the virtual power output terminals of a plurality of basic cells having an isolated time of logical operations in a plurality of basic cells belonging to the n cell groups are connected to each other with the wiring;
   the individual basic cells in the n cell groups, wherein the virtual power nodes are connected to each other with the wiring, belong to cell groups not logically adjoining; and
   the n cell groups are divided by the number of steps of logic circuitry from flip-flops to initially supply signals.

3. A semiconductor integrated circuit device comprising logic circuitry that uses a plurality of basic cells each having a logic output terminal and a virtual power output terminal, further comprising:
   a wiring that connects the virtual power output terminal of a basic cell in the plurality of basic cells to the virtual power output terminal of another basic cell;
   the series of the plurality of basic cells including a first basic cell as one of basic cells in the plurality of basic cells that compose the logic circuitry, and a second basic cell using the output of the first basic cell as an input are treated as a group;
   the virtual power nodes or the virtual power output terminals of individual basic cells in the group are connected to each other with the wiring;
   an optional number of basic cells in a plurality of basic cells that compose logic circuitry are divided into n cell groups, which are first to n-th cell groups each having an optional number of basic cells;
   the virtual power nodes or the virtual power output terminals of a plurality of basic cells having an isolated time of logical operations in a plurality of basic cells belonging to the n cell groups are connected to each other with the wiring;
   the individual basic cells in the n cell groups, wherein the virtual power nodes are connected to each other with the wiring, belong to cell groups not logically adjoining; and
   the n cell groups are divided by the delay time from flip-flops to initially supply signals.

4. A semiconductor integrated circuit device comprising logic circuitry that uses a plurality of basic cells each having therein a logic transistor that performs logical operations and a power switching transistor that can interrupt leakage current when the logic transistor is not operated; and a wiring that connects a virtual power node, which is a connection point between the logic transistor and the power switching transistor and another virtual power node, which is a connection point between the logic transistor and the power switching transistor;

the semiconductor integrated circuit device further comprising logic circuitry that uses a plurality of basic cells each having a logic output terminal and a virtual power output terminal; and a wiring that connects a virtual power output terminal of a basic cell in the plurality of basic cells to a virtual power output terminal of another basic cell;

the series of the plurality of basic cells including a first basic cell as one of basic cells in the plurality of basic cells that compose the logic circuitry, and a second basic cell using the output of the first basic cell as an input are treated as a group; and the virtual power nodes or the virtual power output terminals of individual basic cells in the group are connected to each other with the wiring;

an optional number of basic cells in a plurality of basic cells that compose logic circuitry are divided into n cell groups, which are n cell groups each having an optional number of basic cells; and the virtual power nodes or the virtual power output terminals of a plurality of basic cells having an isolated time of logical operations in a plurality of basic cells belonging to the n cell groups are connected to each other with the wiring;

the individual basic cells in the n cell groups, wherein the virtual power nodes are connected to each other with the wiring, belong to cell groups not logically adjoining; and each of the n cell groups is composed of logic circuitry having common flip-flops to initially supply signals.

5. A semiconductor integrated circuit device comprising logic circuitry that uses a plurality of basic cells each having therein a logic transistor that performs logical operations and a power switching transistor that can interrupt leakage current when the logic transistor is not operated; and a wiring that connects a virtual power node, which is a connection point between the logic transistor and the power switching transistor and another virtual power node, which is a connection point between the logic transistor and the power switching transistor;

the semiconductor integrated circuit device further comprising logic circuitry that uses a plurality of basic cells each having a logic output terminal and a virtual power output terminal; and a wiring that connects a virtual power output terminal of a basic cell in the plurality of basic cells to a virtual power output terminal of another basic cell;

the series of the plurality of basic cells including a first basic cell as one of basic cells in the plurality of basic cells that compose the logic circuitry, and a second basic cell using the output of the first basic cell as an input are treated as a group; and the virtual power nodes or the virtual power output terminals of individual basic cells in the group are connected to each other with the wiring;

an optional number of basic cells in a plurality of basic cells that compose logic circuitry are divided into n cell groups, which are n cell groups each having an optional number of basic cells; and the virtual power nodes or the virtual power output terminals of a plurality of basic cells having an isolated time of logical operations in a plurality of basic cells belonging to the n cell groups are connected to each other with the wiring;

the individual basic cells in the n cell groups, wherein the virtual power nodes are connected to each other with the wiring, belong to cell groups not logically adjoining; and the n cell groups are divided by the number of steps of logic circuitry from flip-flops to initially supply signals; or the delay time from the flip-flops.

* * * * *